US012740352B2

(12) United States Patent
Yong et al.

(10) Patent No.: US 12,740,352 B2
(45) Date of Patent: Sep. 15, 2026

(54) SUBSTRATE PROCESSING METHOD

(71) Applicant: ASM IP Holding B.V., Almere (NL)

(72) Inventors: SangHeon Yong, Yongin-si (KR); HongSuk Kim, Yongin-si (KR); JuHyuk Park, Hwaseong-si (KR); SungHa Choi, Suwon-si (KR); KiHun Kim, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 524 days.

(21) Appl. No.: 18/232,990

(22) Filed: Aug. 11, 2023

(65) Prior Publication Data

US 2024/0063014 A1 Feb. 22, 2024

Related U.S. Application Data

(60) Provisional application No. 63/398,292, filed on Aug. 16, 2022.

(51) Int. Cl.

*H10P 14/60* (2026.01)
*H10P 14/692* (2026.01)
*H10P 14/694* (2026.01)

(52) U.S. Cl.

CPC ...... *H10P 14/6319* (2026.01); *H10P 14/6304* (2026.01); *H10P 14/6336* (2026.01); *H10P 14/6522* (2026.01); *H10P 14/6532* (2026.01); *H10P 14/6682* (2026.01); *H10P 14/6687* (2026.01); *H10P 14/69215* (2026.01); *H10P 14/69433* (2026.01)

(58) Field of Classification Search

CPC ............ H10P 14/6319; H10P 14/6532; H10P 14/6687; H10P 14/6304; H10P 14/69433; H10P 14/6522; H10P 14/6336

See application file for complete search history.

(56) References Cited

U.S. PATENT DOCUMENTS 7,064,072 B1 * 6/2006 Ting .................. H10W 10/0145 257/E21.549
7,915,139 B1 3/2011 Lang
8,557,712 B1 10/2013 Antonelli
9,515,252 B1 * 12/2016 Annunziata ............ H10N 50/01
2011/0111137 A1 * 5/2011 Liang ................ C23C 16/45565 427/579
2013/0217241 A1 8/2013 Underwood
2013/0230987 A1 * 9/2013 Draeger .............. H10P 14/6532 438/694
2017/0335449 A1 * 11/2017 Li ......................... C23C 16/401

FOREIGN PATENT DOCUMENTS

CN 106601676 A * 4/2017 ........... H01L 23/481

* cited by examiner

*Primary Examiner* — Mohammad M Choudhry

(74) *Attorney, Agent, or Firm* — Snell & Wilmer L.L.P.

(57) ABSTRACT

Provided is a method of efficiently forming a dense and solid silicon oxide film on a substrate and a method of manufacturing a semiconductor device by using the same. The formation method comprises: providing a substrate to a reaction chamber; forming a flowable silicon nitride film on the substrate; converting the flowable silicon nitride film into a flowable silicon oxide film; densifying the flowable silicon oxide film; and post-treating the densified silicon oxide film with an inert gas plasma to increase a density of the silicon oxide film.

19 Claims, 5 Drawing Sheets

SUBSTRATE PROCESSING METHOD

CROSS-REFERENCE TO RELATED APPLICATIONS

This application claims priority to U.S. Provisional Patent Application Ser. No. 63/398,292 filed Aug. 16, 2022 titled SUBSTRATE PROCESSING METHOD, the disclosure of which is hereby incorporated by reference in its entirety.

BACKGROUND

1. Field

One or more embodiments relate to a substrate processing method, and more particularly, to a method of efficiently forming a dense and solid silicon oxide film on a substrate.

2. Description of the Related Art

In a semiconductor manufacturing process, a silicon oxide film may be formed largely by two methods. One method is a thermal oxidation process, which involves formation of a silicon oxide film on a substrate at high temperatures of 800° C. to 1,200° C. in an oxygen or steam atmosphere. This process involves supplying oxygen directly to a silicon substrate, thereby converting a portion of the silicon substrate into an insulating material by chemical reaction between silicon and oxygen. The other method is a chemical vapor deposition (CVD) process, which involves supplying a silicon-containing gas and an oxygen-containing gas into a reaction chamber and forming a silicon oxide film on the surface of a substrate by chemical reactions of those gases. The CVD process involves supplying a source gas and a reactant which are chemically reactive to a reaction chamber, and forming a solid product produced from gas-phase reaction on a substrate. Since this process utilizes phase changes from gases with high flowability, the CVD process has advantages such as high film growth rate and high throughput per unit time accordingly, and another advantage is that it is carried out at low temperature compared to the thermal oxidation process. Particularly, unlike the thermal oxidation process, the CVD process may produce silicon oxide films without consuming the silicon constituent of the silicon substrate.

A plasma-enhanced CVD (PECVD) process, while using thermal energy as the energy source for chemical reactions, also uses plasma-generated energy at the same time, and thus may produce silicon oxide films relatively rapidly even at low temperatures compared to the conventional thermal CVD method. However, flowable silicon oxide films deposited by the PECVD process may not be as dense and solid as silicon oxide films formed by the thermal oxidation process, and thus may be inadequate when acting as an etch stop layer against a wet or dry etching, an insulating layer, a device separating layer, or the like.

Therefore, there is a need for processes capable of efficiently forming a dense and solid silicon oxide film of high quality in a semiconductor manufacturing process.

SUMMARY

One or more embodiments include a method of forming a silicon oxide film, which is capable of efficiently forming a dense and solid silicon oxide film of high quality in the semiconductor manufacturing process.

One or more embodiments include a method of manufacturing a semiconductor device by using the above method of forming the silicon oxide film.

Additional aspects will be set forth in part in the description which follows and, in part, will be apparent from the description, or may be learned by practice of the presented embodiments of the disclosure.

According to one or more embodiments, provided is a method of forming a silicon oxide film, the method including providing a substrate into a reaction chamber, supplying a silicon precursor gas and a nitrogen reactant gas to the reaction chamber, and forming a flowable silicon nitride film on the substrate while maintaining a plasma state inside the reaction chamber, converting the flowable silicon nitride film into a flowable silicon oxide film, densifying the flowable silicon oxide film to form a densified silicon oxide film, and post-treating the silicon oxide film with an inert gas plasma to increase the density of the silicon oxide film.

According to a specific embodiment, provided is a method of forming a silicon oxide film, the method including providing a substrate into a reaction chamber, supplying a silicon precursor gas and a nitrogen reactant gas to the reaction chamber, and forming a flowable silicon nitride film on the substrate while maintaining a plasma atmosphere inside the reaction chamber, converting the flowable silicon nitride film into a flowable silicon oxide film, densifying the flowable silicon oxide film to form a densified silicon oxide film, and post-treating the densified silicon oxide film with an inert gas plasma to increase the density of the densified silicon oxide film. Here, the forming a silicon nitride film may be performed by an in-situ plasma treatment which generates a plasma directly on the substrate by applying to the reaction chamber an RF power in a range of more than 0 W to about 500 W and having a frequency of about 10 MHz to about 60 MHz, while supplying the silicon precursor gas and the nitrogen reactant gas to the reaction chamber. Here, the converting may be performed by introducing a remote oxygen plasma to the flowable silicon nitride film. Here, the densifying may be performed by subjecting the flowable silicon oxide film to rapid thermal processing at a pressure of about 1.0 Torr to about 20.0 Torr, and at a high temperature of about 300° C. to about 550° C., while flowing oxygen gas at a flow rate of greater than 0 sccm to about 5,000 sccm. Here, the post-treating may be performed by an in-situ plasma treatment which generates the inert gas plasma directly on the substrate by applying RF power in a range of greater than 0 W to about 1,500 W, having a frequency of about 10 MHz to about 60 MHz, to the reaction chamber while feeding argon (Ar) gas as the inert gas.

According to an additional exemplary embodiment, provided is a method of manufacturing a semiconductor device by using the method of forming a silicon oxide film of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The disclosure is not limited to any particular embodiment(s) disclosed herein, and these and other embodiments will become more fully apparent to those skilled in the art from the following detailed description, taken in conjunction with the accompanying drawings.

DETAILED DESCRIPTION

Figure 1:
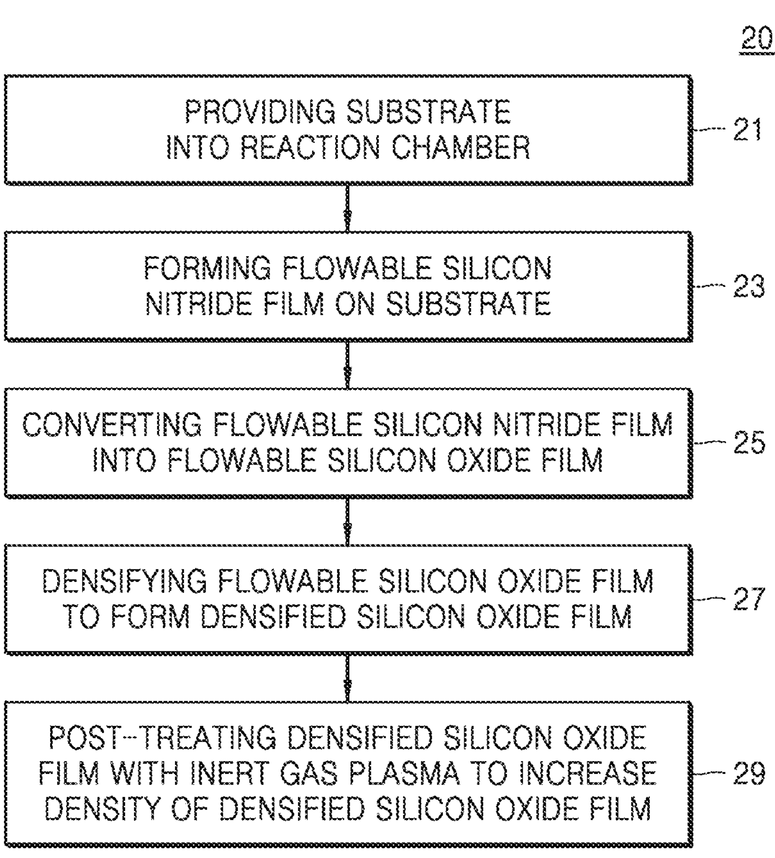
FIG. 1 is a block diagram illustrating a method of forming a silicon oxide film according to at least one embodiment.

Hereinbelow, specific embodiments will be described in greater detail with reference to the accompanied drawings.

The embodiments are provided in order to provide a more thorough understanding of the disclosure to those skilled in the art, and the embodiments disclosed herein may be modified in different forms and the scope of the disclosure should not be limited to the embodiments disclosed herein. Rather, these embodiments are provided so that the disclosure will be thorough and complete, and to fully convey the concept of the disclosure to those skilled in the art.

The terms used herein is for the purpose of describing particular embodiments only, and is not intended to be limiting the disclosure. As used herein, the singular forms are intended to include the plural forms as well, unless the context clearly indicates otherwise. Also, the terms "comprises" and/or "comprising" as used herein specify the presence of stated features, regions, numbers, steps, operations, elements, components, and/or groups but do not preclude the presence or addition of one or more other features, regions, numbers, steps, operations, elements, components, and/or groups thereof. As used herein, the term "and/or" includes any and all combinations of one or more of the associated listed items.

Hereinbelow, embodiments will be described with reference to the drawings schematically illustrating specific embodiments. In the drawings, for example, variations of the depicted shapes may be expected due to production processes and/or tolerances. Thus, embodiments described herein should not be construed as limited to the particular shapes of regions as illustrated herein but are to include deviations in shapes that result, for example, from manufacturing.

First, according to exemplary embodiments, a method of forming a silicon oxide film on a substrate will be described. The method of forming the silicon oxide film on the substrate according to the disclosure may be used to form an electronic device, such as a semiconductor device, by treating a substrate.

FIG. 1 is a block diagram illustrating a method of forming a silicon oxide film according to at least one embodiment.

Referring to FIG. 1, a substrate may be provided into a reaction chamber 21. For example, the reaction chamber may be a reaction chamber in which the semiconductor manufacturing process may be carried out. For example, the reaction chamber may be an in-situ plasma reaction chamber capable of generating a plasma directly near the upper surface of a substrate. Alternatively, the reaction chamber may be a remote plasma reaction chamber, which includes a remote plasma discharge chamber remotely located from this reaction chamber, and a pipe connecting the reaction chamber to the remote plasma discharge chamber.

The substrate may refer to a material or materials, on top of which a device, a circuit, or a film may be formed. The substrate may include bulk materials such as various Group IV materials, e.g., silicon (e.g., single-crystal silicon) and germanium, and compound semiconductor materials, e.g., Group III-V or II-VI semiconductors, and may include one or more layers placed above or below such bulk materials. Further, the substrate may include various topologies formed on its surface, such as recess areas in various forms, including areas referred to as gaps, for example.

In particular, the substrate may include semiconductor materials such as Si or Ge, or various compound semiconductor materials such as SiGe, SiC, GaAs, InAs, and InP, and may include various substrates used in semiconductor devices such as SOI (silicon on insulator) and SOS (silicon on sapphire), and display devices and the like.

In some embodiments, "substrate" may refer to a substrate alone, or a substrate having various surface structures before films according to the disclosure, such as flowable silicon nitride films or silicon oxide films, are formed thereon.

The term "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or refers to a film or non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. For example, a surface of substrate may be a planar surface that is parallel to a horizontal surface, or may be a surface inclined at a certain angle with respect to the horizontal surface. Further, the surface of substrate may be a surface that is convex or concave with respect to the horizontal surface.

The silicon nitride film (or silicon oxide film) formed on the substrate may have flowability, and the flow direction of the silicon nitride film may be closely connected to the direction of a force exerted on the silicon nitride film. For example, if it is gravity that is exerted on the silicon nitride film, the flow direction of the silicon nitride film coincides with the direction of gravity. In this case, if the surface of the substrate is a convex surface, the silicon nitride film may be formed flowing outward from the convex portion. Alternatively, if the surface of the substrate is a concave surface recessed from the horizontal surface, a silicon nitride film having a flowability may be formed flowing towards the concave portion. In the manufacture process of semiconductor devices, examples of the surface of substrate being concave may include a gap structure, a via structure, a step structure, and the like.

Referring back to FIG. 1, a silicon precursor gas and a nitrogen reactant gas may be supplied to the reaction chamber housing the substrate provided therein, and while maintaining a plasma state inside the reaction chamber, a flowable silicon nitride film may be formed on the substrate through a PECVD process 23.

For example, as a silicon precursor in the film-forming step 23, a silicon-containing precursor capable of providing the film being formed with its constituent silicon component may be used. The silicon precursor in the disclosure may comprise, without being limited to, at least one of silicon-containing precursors, such as silicon-containing oligomers, aminosilanes, iodosilanes, silicon hydrohalides, silicon halides, and the like. For example, the silicon-containing precursors may comprise at least one selected from among: TSA, i.e., $(SiH_3)_3N$; DSO, i.e. $(SiH_3)_2$; DSMA, i.e. $(SiH_3)_2NMe$; DSEA, i.e. $(SiH_3)_2NEt$; DSIPA, i.e. $(SiH_3)_2N(iPr)$; DSTBA, i.e. $(SiH_3)_2N(tBu)$; DEAS, i.e. $SiH_3NEt_2$; DTBAS, i.e. $SiH_3N(tBu)_2$; BDEAS, i.e. $SiH_2(NEt_2)_2$; BDMAS, i.e. $SiH_2(NMe_2)_2$; BTBAS, i.e. $SiH_2(NHtBu)_2$; BITS, i.e. $SiH_2(NHSiMe_3)_2$; DIPAS, i.e. $SiH_3N(iPr)_2$; TEOS, i.e. $Si(OEt)_4$; $SiCl_4$; HCD, i.e. $Si_2Cl_6$; 3DMAS, i.e. $SiH(N(Me)_2)_3$; BEMAS, i.e. $SiH_2[N(Et)(Me)]_2$; AHEAD, i.e. $Si_2(NHEt)_6$; TEAS, i.e. $Si(NHEt)_4$; $Si_3H_8$; DCS i.e. $SiH_2Cl_2$; $SiHI_3$; $SiH_2I_2$; and/or silicon-containing oligomers having about 2 to 10 repeating units, and the like. Specific examples of the silicon-containing oligomers may include, without being limited to dimer-trisilylamine, trimer-trisilylamine, tetramer-trisilylamine, pentamer-trisilylamine, hexamer-trisilylamine, heptamer-trisilylamine, octamer-trisilylamine, and the like. In another embodiment, the silicon precursor may be a carbon-free silicon precursor and may be at least one selected from among silane ($SiH_4$), disilane ($Si_2H_6$), trisilylamine, silicon hydrohalides, and silicon halides. A single silicon precursor may be supplied to the reaction chamber, or two or more silicon precursors may be supplied to the reaction chamber together.

As a nitrogen reactant, a nitrogen-containing gas capable of providing a nitrogen component to the film may be used, for example. The nitrogen-containing gas may comprise, without being limited to, at least one selected from among $NH_3$, $N_2$, $N_2O$, $NO_2$, $N_2H_2$, $N_2H_4$, and a mixture thereof. In one embodiment, $NH_3$ gas may be used as the nitrogen reactant.

The nitrogen reactant may serve to facilitate a condensation reaction and cross-linking during oligomerization of a silicon precursor. This may result in a more complete bond structure of the resulting silicon nitride film. If the silicon nitride film is to be formed on a substrate having gap structures, only by supplying a silicon precursor source and without supply of any nitrogen reactant, for example, $NH_3$ plasma, void-free gap filling may become difficult. The silicon precursor gas and the nitrogen reactant gas may be supplied together with argon gas serving as a carrier gas.

The temperature of a substrate inside a reaction chamber may be maintained at a temperature of about 0° C. to about 150° C., for example, about 30° C. to about 70° C. In addition, the temperature of a silicon precursor vessel may be maintained at a temperature of about 0° C. to about 150° C., for example, about 30° C. to about 70° C. To create a plasma state inside the reaction chamber, a relatively low RF power, for example, an RF power in a range of greater than 0 W to about 500 W, about 100 W to about 500 W, particularly, about 200 W to about 400 W, may be applied. The RF frequency used here may be a frequency of about 10 MHz to about 60 MHz, preferably about 20 MHz to about 30 MHz. During the formation of the film, the pressure inside the reaction chamber may be maintained within a range of about 1.0 Torr to about 9.0 Torr, more specifically, about 2.0 Torr to about 6.0 Torr. To create a plasma atmosphere in the reaction chamber, exemplary embodiments may utilize an in-situ plasma treatment which generates a plasma directly on the substrate by applying RF power directly to the reaction chamber while supplying the silicon precursor gas and the nitrogen reactant gas to the reaction chamber together.

A silicon precursor supplied into the reaction chamber with a nitrogen reactant starts to flow on the substrate with flowability due to thermal energy supplied to the substrate inside the reaction chamber in the plasma atmosphere, and as a result, may form a flowable silicon nitride film on the substrate. Here, to allow the silicon precursors to have appropriate flowability, the temperature of the substrate may be maintained at a relatively low temperature, for example of about 150° C. or less, or for example, at a temperature between about 30° C. and about 70° C. The temperature of the substrate may be adjusted by directly controlling the temperature of a heating block on which the substrate is mounted, or by controlling the temperature of atmosphere inside the reaction chamber, or by controlling a vessel temperature of a silicon precursor source.

When a monomeric silicon precursor source is supplied onto a substrate maintained within the above temperature range, the silicon precursor may evaporate too easily, resulting in the loss of flowability. Meanwhile, if a polymeric silicon precursor having a complex molecular structure is supplied, the silicon precursor may not be able to achieve significant flowability. Therefore, for a silicon source in the above substrate temperature range to be able to have a flowability on the substrate that is significant and also appropriate for the semiconductor manufacturing process, a silicon precursor with a molecular structure that is not too simple nor too complex may be used.

In another embodiment, the silicon precursor may be free of carbon. Carbon may act as impurities within a film and cause a change to etching characteristics of the film. Therefore, supplying a carbon-free silicon source may lead to formation of films with more uniform etching characteristics.

The silicon precursor supplied to the substrate flows on the substrate, and while the silicon precursor flows on the substrate, silicon precursor molecules bond together and a chain structure having about 10 repeating units may be formed. This process is called oligomerization. The oligomerization process may be facilitated through a condensation reaction between silicon precursor molecules. In the condensation reaction, hydrogen may be removed from Si—H bonds in the silicon precursor as reaction byproducts. Oligomers bonded through the condensation reaction, while flowing within a silicon nitride film having flowability, may form cross-linked structures via cross-linking. As a result, a flowable silicon nitride film may be formed on the substrate 23.

Here, if the ratio of Si atoms:N atoms inside the silicon nitride film is 1:1 or less (1:≤1) (for example, 1:0.5), that is, if the number of nitrogen atoms inside the silicon nitride film is less than that of silicon atoms, the cross-linking inside the film may be hindered, resulting in a partial oligomerization. Such partial oligomerization not only diminishes mechanical properties, e.g., strength, of the resulting silicon nitride film, but also may act as a cause of shrinkage of the silicon nitride film in the post-treatment process described infra. Therefore, to address nitrogen atom deficiency in the silicon nitride film, a nitrogen reactant may be supplied along with a silicon precursor source to thereby additionally supply nitrogen atoms to the silicon nitride film. If the ratio of Si atoms:N atoms inside the silicon nitride film is 1:1 or more (1:≥1) (for example, 1:1.5), that is, if the number of nitrogen atoms inside the silicon nitride film becomes equal to or greater than that of silicon atoms, oligomerization may be facilitated as crosslinks are formed more efficiently, and also, pore formation inside the silicon nitride film may be suppressed.

Therefore, to facilitate oligomerization of the silicon nitride film and suppress pore formation inside the silicon nitride film, it may be necessary not only to supply a nitrogen reactant with a silicon precursor, but also to provide a sufficient supply of the nitrogen reactant with respect to the silicon precursor. For example, the silicon precursor and the nitrogen reactant may be supplied such that the ratio of Si atoms:N atoms inside the silicon nitride film is 1:≥1 (e.g. 1:1.5). In some embodiments, when using $NH_3$ as the nitrogen reactant, the supply amount of $NH_3$ may be, for example, within a range of greater than 0 sccm to about 2,500 sccm, preferably, about 200 sccm to about 2,000 sccm.

Referring back to FIG. 1, conversion 25 for converting the flowable silicon nitride film formed on the substrate into a flowable silicon oxide film may be performed.

The conversion 25 includes converting the flowable silicon nitride film into the flowable silicon oxide film by introducing a remote $O_2$ plasma to the flowable silicon nitride film. The remote oxygen plasma used in the conversion 25 may be formed by applying, from a remote plasma discharge chamber remotely located from the reaction chamber, RF power in a range of greater than 0 W to about 5,000 W, for example, about 1,000 W to about 4,000 W, more specifically, about 2,000 W to about 2,500 W, having a frequency of about 10 MHz to about 60 MHz, for example, about 13.56 MHz to about 30 MHz. Subsequently, the remote oxygen plasma may be introduced into the reaction chamber through a pipe. During the conversion, the pressure inside the reaction chamber may be maintained within a range of about 1.0 Torr to about 9.0 Torr, particularly, about 2.0 Torr to about 3.0 Torr. Here, to allow the flowable silicon nitride film to be converted into the flowable silicon oxide film, the temperature of the substrate may be maintained at a relatively low temperature, for example of about 0° C. to about 300° C., about 50° C. to about 200° C., or about 50° C. to about 150° C.

Referring to FIG. 1, densification 27 may be performed on the flowable silicon oxide film formed on the substrate. Through the densification 27, the flowable silicon oxide film may be densified and cured solid. The densification 27 may include forming a densified silicon oxide film by subjecting the flowable silicon oxide film to rapid thermal processing while flowing oxygen gas at a flow rate of greater than 0 sccm to about 5,000 sccm. Process conditions for the rapid thermal processing may include maintaining at a pressure of about 1.0 Torr to about 20.0 Torr, for example, about 2.0 Torr to about 15.0 Torr, particularly, about 5.0 Torr to about 10.0 Torr; and at a temperature of about 50° C. to about 650° C., for example, about 100° C. to about 600° C., particularly, about 300° C. to about 550° C., or about 500° C. to about 550° C. As the surface of the silicon oxide film becomes densified and solid through the densification 27, exterior impurities such as carbon or nitrogen may be stopped from penetrating into the silicon oxide film. In one embodiment, the densification 27 may be carried out in a separate apparatus, for example, a thermal processing apparatus. For example, after the flowable silicon nitride film is formed on a substrate and converted into the flowable silicon oxide film inside the reaction chamber, the substrate may be transferred to a thermal processing chamber to perform a densification process. In another embodiment, the formation, conversion and densification of the film may be carried out in a single reaction chamber in-situ.

Referring back to FIG. 1, a post-treatment may be performed on the silicon oxide film formed on the substrate 29. The post-treatment is to further densify the surface of the silicon oxide film and thus may further prevent exterior impurities such as carbon or nitrogen, from penetrating into the silicon oxide film. The post-treatment 29 may include post-treating the silicon oxide film with an inert gas plasma to increase the density of the silicon oxide film. The post-treatment using a plasma may be carried out by an in-situ plasma treatment method that generates a plasma on a substrate while supplying an inert gas, for example, argon (Ar) gas or helium (He) gas. To further promote densification of the film through an ion bombardment effect, it may be more effective to use argon gas which has a greater atomic mass.

The temperature of the substrate inside the reaction chamber may be maintained at a temperature of about 0° C. to about 150° C., for example, about 50° C. to about 150° C. To create a plasma atmosphere inside the reaction chamber, RF power, for example, an RF power in a range of greater than 0 W to about 1,500 W, about 100 W to about 1,000 W, particularly, about 500 W to about 900 W, may be applied. The RF frequency used here may be a frequency of about 10 MHz to about 60 MHz, preferably, about 20 MHz to about 30 MHz. The pressure inside the reaction chamber may be maintained within a range of about 1.0 Torr to about 9.0 Torr, particularly, about 2.0 Torr to about 5.0 Torr. To create a plasma atmosphere in the reaction chamber, exemplary embodiments may utilize an in-situ plasma treatment that generates an inert gas plasma directly on a substrate by applying RF power directly to the reaction chamber while supplying a silicon precursor gas and a nitrogen reactant gas to the reaction chamber together.

In the film forming method according to embodiments, when trying to reduce the wet etch rate ratio (WERR) for a silicon oxide film, WERR reduction may be achieved more rapidly with application of an Ar gas plasma after densification of the silicon oxide film, compared to when there is no Ar gas plasma application after densification of the silicon oxide film. Here, the wet etch rate ratio (WERR) is defined as the ratio of the wet etch rate (WER) of a silicon oxide film formed by the flowable PECVD of the present disclosure, with respect to the WER of a silicon oxide film formed by the thermal oxide film process under an oxygen or vapor atmosphere at 1,100° C. In particular, the WERs are calculated through a process where a substrate including a target to-be-measured silicon oxide film is immersed for a certain time (e.g., 60 seconds) in 1:100 dilute hydrofluoric acid (dHF) followed by measurement of a thickness etched by dHF.

For example, the WERR is defined as the ratio of wet etch rate (WER1) of a silicon oxide film formed by the flowable PECVD method to wet etch rate (WER2) of a silicon oxide film formed by the thermal oxide film process and may be expressed as the following equation.

$$\text{WERR}(\%)=(\text{WER }1/\text{WER }2)\times 100.$$

In the conventional process, after forming a flowable silicon nitride film, at least 30 minutes of the conversion process, and at least 3 hours of the densification process are performed to achieve the WERR reduction of about 10%. In contrast, in the film forming method according to embodiments, at least 30 minutes of the densification 27, and 10 minutes or more, that is, no more than 10 minutes of the post-treatment 29 using an argon (Ar) gas plasma are sufficient to bring about a sufficient WERR reduction of about 10% or higher. That is, for the same extent of WERR reduction to be achieved, while the conventional method requires at least 3 hours or more for the film conversion and 30 minutes or more for the film densification. In contrast, embodiments according to the present disclosure only require about 30 minutes or more for the film densification and 10 minutes or more for the post-treatment, thus drastically reducing the substrate treatment time for film densification and achieving a targeted WERR.

Figure 2:
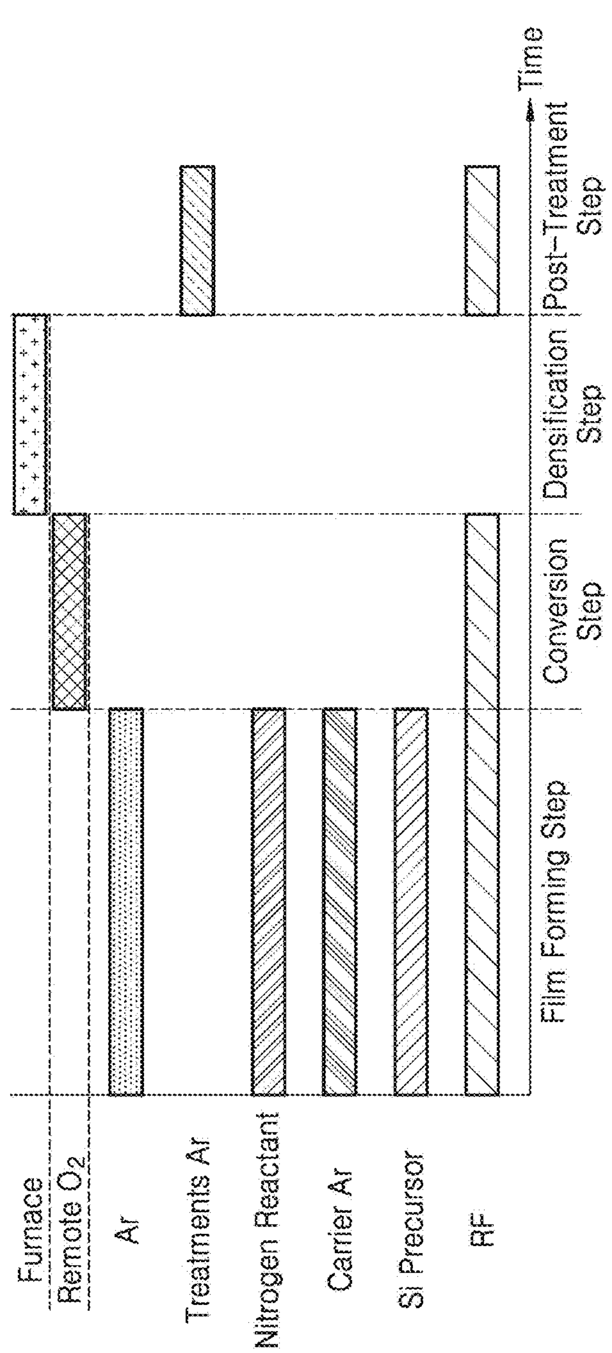
FIG. 2 is a schematic diagram illustrating a process sequence of a method of forming a silicon oxide film with increased density according to an exemplary embodiment.

FIG. 2 is a schematic diagram illustrating a process sequence of a method of forming a silicon oxide film with increased density according to an exemplary embodiment.

Referring to FIG. 2, the method of forming the silicon oxide film according to an exemplary embodiment may broadly include, along the horizontal axis indicating time, a film forming step for forming a flowable silicon nitride film, a conversion step, a densification step, and a post-treatment step.

Referring to FIG. 2, in the film forming step, a silicon precursor gas and a nitrogen reactant gas may be supplied to a reaction chamber, and while maintaining a plasma atmosphere inside the reaction chamber, a flowable silicon nitride film may be formed on a substrate through the PECVD process.

In the film forming step, as a silicon precursor, for example, a silicon-containing precursor that is capable of providing a silicon component to the film may be used. The silicon precursor may comprise, without being limited to, at least one or a mixture of silicon-containing oligomers, aminosilanes, iodosilanes, silicon hydrohalides, and silicon halides. In another embodiment, the silicon precursor may be a carbon-free silicon precursor and may be at least one selected from among silane ($SiH_4$), disilane ($Si_2H_6$), silicon halides, and trisilylamine. A single silicon precursor may be supplied to the reaction chamber, or two or more silicon precursors may be supplied to the reaction chamber together.

As the nitrogen reactant, for example, a nitrogen-containing gas capable of providing a nitrogen component to the film may be used. The nitrogen-containing gas may comprise, without being limited to, at least one selected from among $NH_3$, $N_2$, $N_2O$, $NO_2$, $N_2H_2$, $N_2H_4$, and a mixture thereof. In particular, $NH_3$ gas may be used as the nitrogen reactant.

The nitrogen reactant may serve to facilitate the condensation reaction and cross-linking during oligomerization of a silicon precursor. As a result, the resulting silicon nitride film may have a more complete bond structure. If a silicon nitride film is to be formed on a substrate having gap structures, only by supplying a silicon precursor source and without supply of any nitrogen reactant, for example, $NH_3$ plasma, void-free gap filling may become difficult.

The silicon precursor gas and the nitrogen reactant gas may be supplied to the reaction chamber together with argon gas serving as a carrier gas. Here, the silicon precursor gas may be carried by the argon carrier gas, and inside the reaction chamber, a purge gas, for example, argon gas, may continuously flow.

The temperature of the substrate in the reaction chamber may be maintained at a temperature of about 0° C. to about 150° C., for example, about 30° C. to about 70° C. In addition, the temperature of a silicon precursor vessel may be maintained at about 0° C. to about 150° C., for example, about 30° C. to about 70° C. To create a plasma atmosphere inside the reaction chamber, a relatively low RF power, for example, RF power in a range of greater than 0 W to about 500 W, about 100 W to about 500 W, particularly, about 200 W to about 400 W, may be applied. The RF frequency used here may be a frequency of about 10 MHz to about 60 MHz, preferably about 20 MHz to about 30 MHz. During the formation of the film, the pressure inside the reaction chamber may be maintained in a range of about 1.0 Torr to about 9.0 Torr, more specifically, about 2.0 Torr to about 6.0 Torr. To create a plasma atmosphere in the reaction chamber, exemplary embodiments may utilize an in-situ plasma treatment that generates a plasma directly on a substrate by applying RF power directly to the reaction chamber while supplying a silicon precursor gas and a nitrogen reactant gas to the reaction chamber together.

A silicon precursor supplied to the reaction chamber with a nitrogen reactant starts to flow with flowability on the substrate due to thermal energy supplied to the substrate inside the reaction chamber in the plasma atmosphere, and as a result, forms a flowable silicon nitride film on the substrate. Here, to allow the silicon precursor to have appropriate flowability, the temperature of the substrate may be maintained at a relatively low temperature, for example, of about 150° C. or less, or at a temperature between about 30° C. and about 70° C., for example. If a monomeric silicon precursor source is supplied to a substrate maintained within such a temperature range, the silicon precursor may evaporate too easily, resulting in the loss of flowability. On the contrary, if a polymeric silicon precursor source having a complex molecular structure is supplied, the silicon precursor may not be able to achieve a significant flowability. Therefore, the silicon precursor used may be a silicon precursor with a molecular structure that is not too simple nor too complex, such that the silicon source in the above temperature range of substrate may have a flowability on the substrate that is significant and also appropriate for the semiconductor manufacturing process.

In another example, when the silicon precursor contains, for example, a carbon-containing group such as methyl, ethyl or propyl groups, carbon-containing materials may be generated during the process of forming silicon nitride films. Carbon may act as impurities within a film, lowering the purity of the film, or may cause change to characteristics of the film, e.g., etch rate, and thus may act as a cause of device failure in subsequent processes. Therefore, as the silicon precursor, it may be preferable to use a silicon precursor that may have an appropriate molecular weight and does not contain carbon.

The silicon precursor, once supplied to the substrate, flows on the substrate, and while the silicon precursor flows on the substrate, silicon precursor molecules bond together and a chain structure having about 10 repeating units may be formed. This process is called oligomerization. The oligomerization process may be facilitated through a condensation reaction between silicon precursor molecules. In the condensation reaction, hydrogen may be removed from the Si—H bonds in the silicon precursor as reaction byproducts. Oligomers bonded through the condensation reaction may form cross-linked structures via crosslinking while flowing inside the silicon nitride film having flowability. As a result, a flowable silicon nitride film may be formed on the substrate.

To facilitate the oligomerization of the silicon nitride film and suppress pore formation inside the silicon nitride film, it is necessary to supply a nitrogen reactant with a silicon precursor and also to provide a sufficient amount of the nitrogen reactant with respect to the silicon precursor. For example, the silicon precursor and the nitrogen reactant may be supplied such that the ratio of Si atoms:N atoms inside the silicon nitride film becomes 1:1 or more (1:≥1) (e.g. 1:1.5). In some embodiments, when using $NH_3$ as the nitrogen reactant, the supply amount of $NH_3$ may be, for example, within a range of greater than 0 sccm to about 2,500 sccm, preferably, about 200 sccm to about 2,000 sccm.

Referring back to FIG. 2, following the film forming step, the conversion step for converting the flowable silicon nitride film formed on the substrate into a flowable silicon oxide film may be performed.

The conversion step may include converting the flowable silicon nitride film into the flowable silicon oxide film by introducing a remote oxygen ($O_2$) plasma to the flowable silicon nitride film. The remote oxygen plasma used in the conversion process may be formed by applying, from a remote plasma discharge chamber remotely located from the reaction chamber, an RF power in a range of greater than 0 W to about 5,000 W, for example, about 1,000 W to about 4,000 W, particularly about 2,000 W to about 2,500 W, and having a frequency of about 10 MHz to about 60 MHz, for example, about 13.56 MHz to about 30 MHz. Subsequently, the remote oxygen plasma may be introduced into the reaction chamber through a pipe. During the conversion process, the pressure inside the reaction chamber is to be maintained in a range of about 1.0 Torr to about 9.0 Torr, particularly, about 2.0 Torr to about 3.0 Torr. Here, to allow the flowable silicon nitride film to be effectively converted into the flowable silicon oxide film, the temperature of the substrate may be maintained at a relatively low temperature, for example of about 0° C. to about 300° C., about 50° C. to about 200° C., or about 50° C. to about 150° C.

Referring back to FIG. 2, following the conversion step, a densification step may be performed on the flowable silicon oxide film formed on the substrate. Through the densification step, the flowable silicon oxide film may be densified and cured solid. The densification step may include forming a densified silicon oxide film by subjecting the flowable silicon oxide film to rapid thermal processing while flowing oxygen gas at a flow rate of greater than 0 sccm to about 5,000 sccm. The process conditions for the rapid thermal processing may include maintaining at a pressure of about 1.0 Torr to about 20.0 Torr, for example, about 2.0 Torr to about 15.0 Torr, particularly, about 5.0 Torr to about 10.0 Torr; and at a temperature of about 50° C. to about 650° C., for example, about 100° C. to about 600° C., particularly, about 300° C. to about 550° C., or about 500° C. to about 550° C. The surface of the silicon oxide film becomes densified through the densification step, and thus may prevent exterior impurities such as carbon or nitrogen from penetrating into the silicon oxide film. In one embodiment, the densification step may be carried out by transporting the substrate from a film forming chamber to another apparatus. For example, the densification step may be carried out in a furnace or a rapid thermal processing or rapid thermal annealing (RTP or RTA) system.

Referring back to FIG. 2, the post-treatment step may be performed on the densified silicon oxide film formed on the substrate. The post-treatment process is to further densify the surface of the silicon oxide film and may further prevent exterior impurities, such as carbon or nitrogen, from penetrating into the silicon oxide film. The post-treatment process may include post-treating the silicon oxide film with an inert gas plasma to increase the density of the silicon oxide film. The post-treatment process using plasma may be carried out by an in-situ plasma treatment method that generates a plasma on a substrate while supplying an inert gas, for example, argon (Ar) gas.

The temperature of the substrate inside the reaction chamber may be maintained at a temperature of about 0° C. to about 150° C., for example, about 50° C. to about 150° C. To create a plasma atmosphere inside the reaction chamber, RF power, for example, an RF power in a range of greater than 0 W to about 1,500 W, about 100 W to about 1,000 W, particularly, about 500 W to about 900 W, may be applied. The RF frequency used here may be a frequency of about 10 MHz to about 60 MHz, preferably about 20 MHz to about 30 MHz. The pressure inside the reaction chamber may be maintained in a range of about 1.0 Torr to about 9.0 Torr, particularly, about 2.0 Torr to about 5.0 Torr. To create a plasma atmosphere in the reaction chamber, exemplary embodiments may utilize an in-situ plasma treatment that generates an inert gas plasma directly on a substrate by applying RF power directly to the reaction chamber while supplying a silicon precursor gas and a nitrogen reactant gas to the reaction chamber together.

The wet etch rate (WER) of the silicon oxide film after performing the post-treatment step using an Ar gas plasma may be reduced by at least 10%, compared to the WER of the silicon oxide film after performing the preceding densification step.

In particular, to achieve about 10% reduction in WERR with respect to a silicon oxide film formed by the thermal oxide film process, the conventional process requires at least about 3 hours or more for the film conversion and 30 minutes or more for the densification after performing a film forming step (i.e. forming a flowable nitride film). In contrast, embodiments according to the present disclosure only require at least about 30 minutes or more for the film densification and about 10 minutes or more for the argon (Ar) post-treatment. Thus the substrate treatment time for film densification and achieving a targeted WERR may be drastically reduced.

Meanwhile, although not specifically illustrated, a purge step may be included between the film forming step and the conversion step, between the conversion step and the densification step, and/or between the densification step and the post-treatment step. In the purge step, excess of silicon precursor(s) or nitrogen reactant(s) remaining from the film forming step, and/or reaction byproducts, may be removed. Also, during the film forming step, the silicon precursor(s) or nitrogen reactant(s) may be supplied continuously, but they may also be supplied intermittently. In the latter case, purging may be carried out when the silicon precursor(s) and nitrogen reactant(s) are not supplied.

Also, although not specifically illustrated, the film forming step may be performed multiple times until a desired film thickness is obtained, and the post-treatment step may also be performed multiple times until a desired surface density is obtained.

EXAMPLES

Hereinbelow, a method of forming a silicon oxide film according to exemplary examples was performed according to a process described with reference to FIGS. 1 and 2. As a silicon precursor source, a silicon-containing oligomer, e.g., trisilylamine-based oligomer precursors, was used, and $NH_3$ gas was used as a nitrogen reactant. Table 1 shows specific process conditions for each step of the method of forming the silicon oxide film with increased density according to the present example.

TABLE 1

| | Process Conditions | | | |
|---|---|---|---|---|
| Step | Items | | Flow Rate (sccm) | Process Time (sec) |
| Film forming step | Gas | Carrier Ar | 0> to 3,000 (preferably 500 to 2000) | 30 to 90 (preferably 50 to 70) |
| | | $NH_3$ | 0> to 2,500 (preferably 200 to 2,000) | |
| | | Si Precursor | 0> to 3,000 (preferably 500 to 2,000) | |
| | | Ar | 0> to 3,000 (preferably 500 to 2,000) | |
| | Plasma Conditions | RF Power (W) | 0> to 500 (preferably 200 to 400) | |
| | | RF Frequency (MHz) | 10 to 60 (preferably 13.56 to 30) | |
| | Process Pressure (Torr) | | 1.0 to 9.0 (preferably 2.0 to 6.0) | |
| | Process Temperature (° C.) | | 0 to 150 (preferably 30 to 70) | |
| Conversion step | Gas | $O_2$ | 0> to 5,000 (preferably 2,000 to 2,500) | 0.1 to 20,000 (preferably 1,800<) |
| | | Ar | 0> to 1,500 (preferably 800 to 1,200) | |
| | Plasma Conditions | RF Power (W) | 0> to 5,000 (preferably 1,000 to 2,500) | |
| | | RF Frequency (MHz) | 10 to 60 (preferably 13.56 to 30) | |
| | Process Pressure (Torr) | | 1.0 to 9.0 (preferably 2.0 to 3.0) | |
| | Process Temperature (° C.) | | 0 to 300 (preferably 50 to 150) | |
| Densification step | Gas | $O_2$ | 0> to 5,000 (preferably 500 to 1,500) | 0.1 to 50,000 (preferably 3,600<) |
| | Process Pressure (Torr) | | 1.0 to 20.0 (preferably 5.0 to 10.0) | |
| | Process Temperature (° C.) | | 50 to 650 (preferably 300 to 550) | |
| Post treatment step | Gas (sccm) | Ar | 0 to 3,000 (preferably 200 to 2,000) | 0.1-3,600 (preferably 1,800<) |
| | Plasma Conditions | RF Power (W) | 0 to 1,500 (preferably 500 to 900) | |
| | | RF Frequency (MHz) | 10 to 60 (preferably 13.56-30) | |
| | Process Pressure (Torr) | | 1.0 to 9.0 (preferably 2.0 to 5.0) | |
| | Process Temperature (° C.) | | 0 to 150 (preferably 50 to 150) | |

On the silicon oxide thin films obtained, transmission electron microscopy (TEM) images and Fourier transformation-infrared (FT-IR) spectrums were obtained, and WERR analysis was performed to compare changes to characteristics of the thin films with, and without, argon (Ar) plasma post-treatment.

Figure 3A:
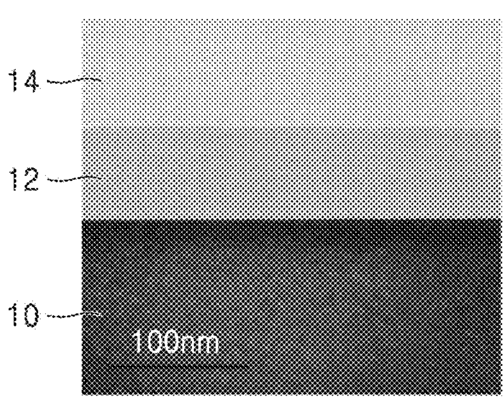
FIGS. 3A and 3B are cross-sectional transmission electron microscopy (TEM) images for examining the presence of damage in an upper portion of a silicon oxide thin film before and after performing a post-treatment step using an argon (Ar) gas plasma.
Figure 3B:
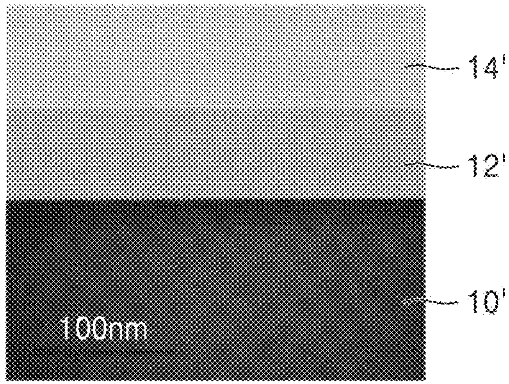

FIG. 3A and FIG. 3B are cross-sectional transmission electron microscope (TEM) images for examining the presence of damage in an upper portion of a silicon oxide thin film before and after performing the post-treatment step using an argon (Ar) gas plasma. FIG. 3A is a cross-sectional TEM image of a silicon oxide thin film after performing the densification step, but before performing the post-treatment step. FIG. 3B is a cross-sectional TEM image of a silicon oxide thin film after both the performing the densification step and the post-treatment step.

FIG. 3A and FIG. 3B illustrate a silicon oxide thin film (12, 12') formed on a silicon substrate (10, 10'). Reference numeral 14 or 14' indicates background space. FIG. 3A and FIG. 3B show that there was no change to the upper portion of the thin film before and after performing the Ar plasma post-treatment, and also no remarkable change in terms of the thickness of the thin film around 65 nm. This indicates that even with the Ar plasma post-treatment, there was no plasma-induced damage to or shrinkage of the thin films.

Figure 4:
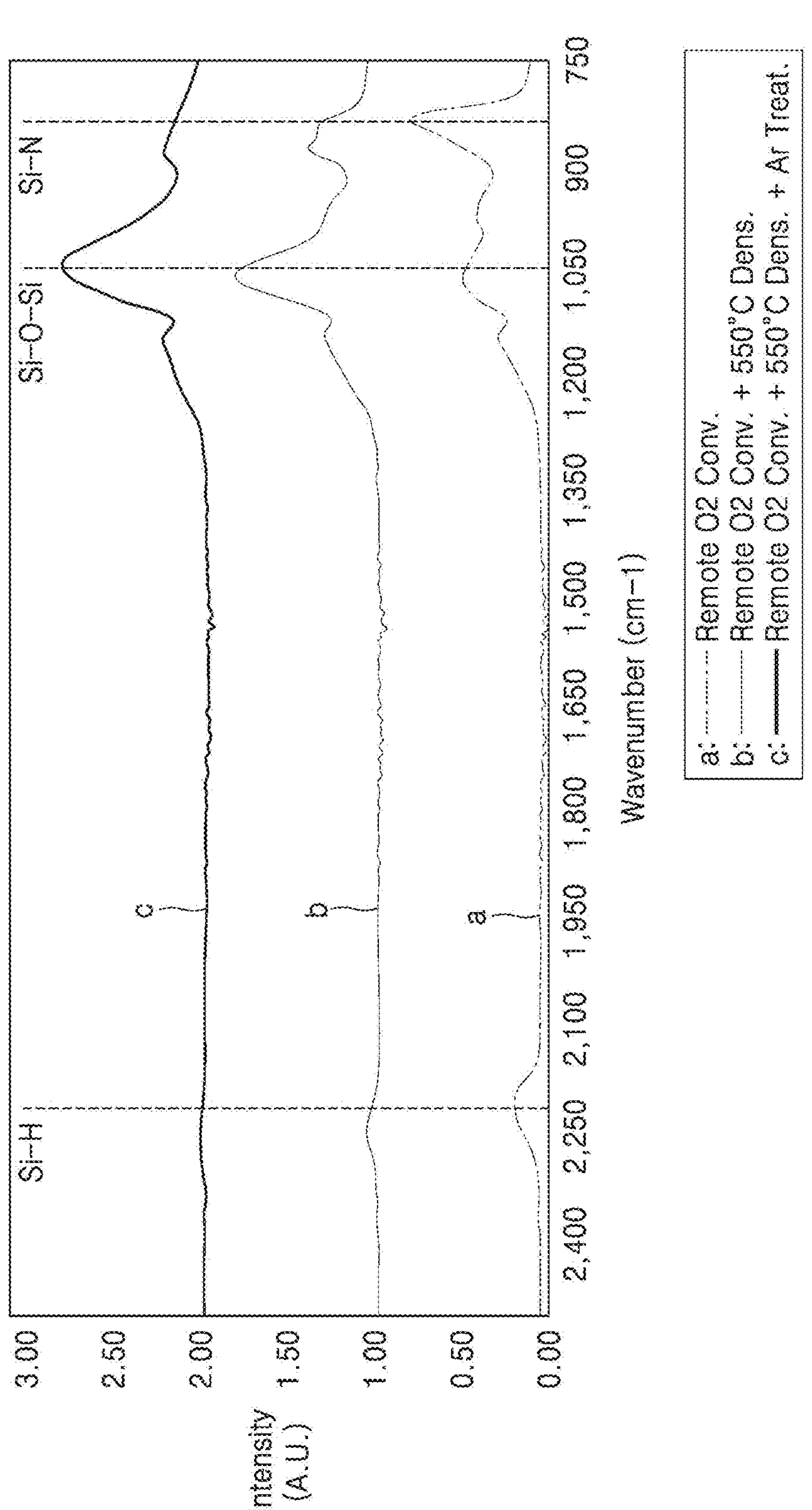
FIG. 4 shows Fourier-transformation infrared spectroscopy (FT-IR) spectra for analyzing a bond state in a silicon oxide thin film after performing a conversion step (line a), after performing a densification step (line b), and after performing a post-treatment step using an argon (Ar) gas plasma (line c).

FIG. 4 shows Fourier-transformation infrared spectroscopy (FT-IR) spectra for analyzing a bond state of a silicon oxide thin film after performing a conversion step (line a), after performing a densification step at 550° C. (line b), and after performing an Ar plasma post-treatment step (line c).

In particular, FIG. 4 shows changes in FT-IR spectra of a silicon oxide thin film after performing the conversion step (line a), after performing the densification step at 550° C. (line b), and after performing the Ar plasma post-treatment step (line c), respectively. These spectra show that the intensity of the Si—O—Si peak was increased in the thin film after performing ae densification (line b), and in particular, in the thin film after performing a densification and an Ar plasma post-treatment (line c), the intensity of the Si—N peak and Si—H peak was decreased. This may be attributed to decreased amounts of Si—H bonds and Si—N bonds and an increased amount of Si—O bonds in the thin film subjected to the Ar plasma post-treatment as it undergoes further densification. This result indicates that as condensation and crosslinking reactions progress to a further extent following the Ar plasma post-treatment, the N and H ratios in the silicon oxide thin film decrease. Accordingly, performing the Ar plasma post-treatment may provide a technical advantage of further facilitating the conversion of a silicon nitride film into a silicon oxide film and increasing the density of the silicon oxide film.

Table 2 shows the concentration of each element in a silicon oxide thin film after performing the densification step at 550° C., and in a silicon oxide thin film after performing both the densification step at 550° C. and the Ar plasma post-treatment step, as obtained by Rutherford backscattering spectroscopy (RBS) and X-ray photoelectron spectroscopy (XPS) analyses. Table 2 shows that similar results as the FT-IR results in FIG. 4 were obtained. In particular, this result shows that in the silicon oxide thin film subjected to the Ar plasma post-treatment, the N and H ratios in the thin film were decreased. This also may be attributed to a decrease in the amount of Si—N and S—H bonds, as described with respect to the FT-IR results above.

TABLE 2

| | Silicon oxide film after performing densification step | | Silicon oxide film after performing both densification step and Ar plasma post-treatment step | |
|---|---|---|---|---|
| | RBS | XPS | RBS | XPS |
| Si (atomic %) | 28.7 | 36.7 | 28.9 | 36.9 |
| O (atomic %) | 60.0 | 61.5 | 56.0 | 61.5 |
| N (atomic %) | 3.7 | 1.8 | 2.6 | 1.6 |
| H (atomic %) | 7.6 | — | 5.0 | — |

Subsequently, the silicon oxide thin film after performing the densification step at 550° C., and the silicon oxide thin film after performing the Ar plasma post-treatment step were evaluated for their respective wet etch rates (WER), and the results thereof were compared to the WER of the silicon oxide thin film obtained by the thermal oxidation process at 1,000° C. Etching characteristics were evaluated through a process where each sample was immersed for 60 seconds in 1:100 dilute hydrofluoric acid, followed by comparison of etched thicknesses.

Figure 5:
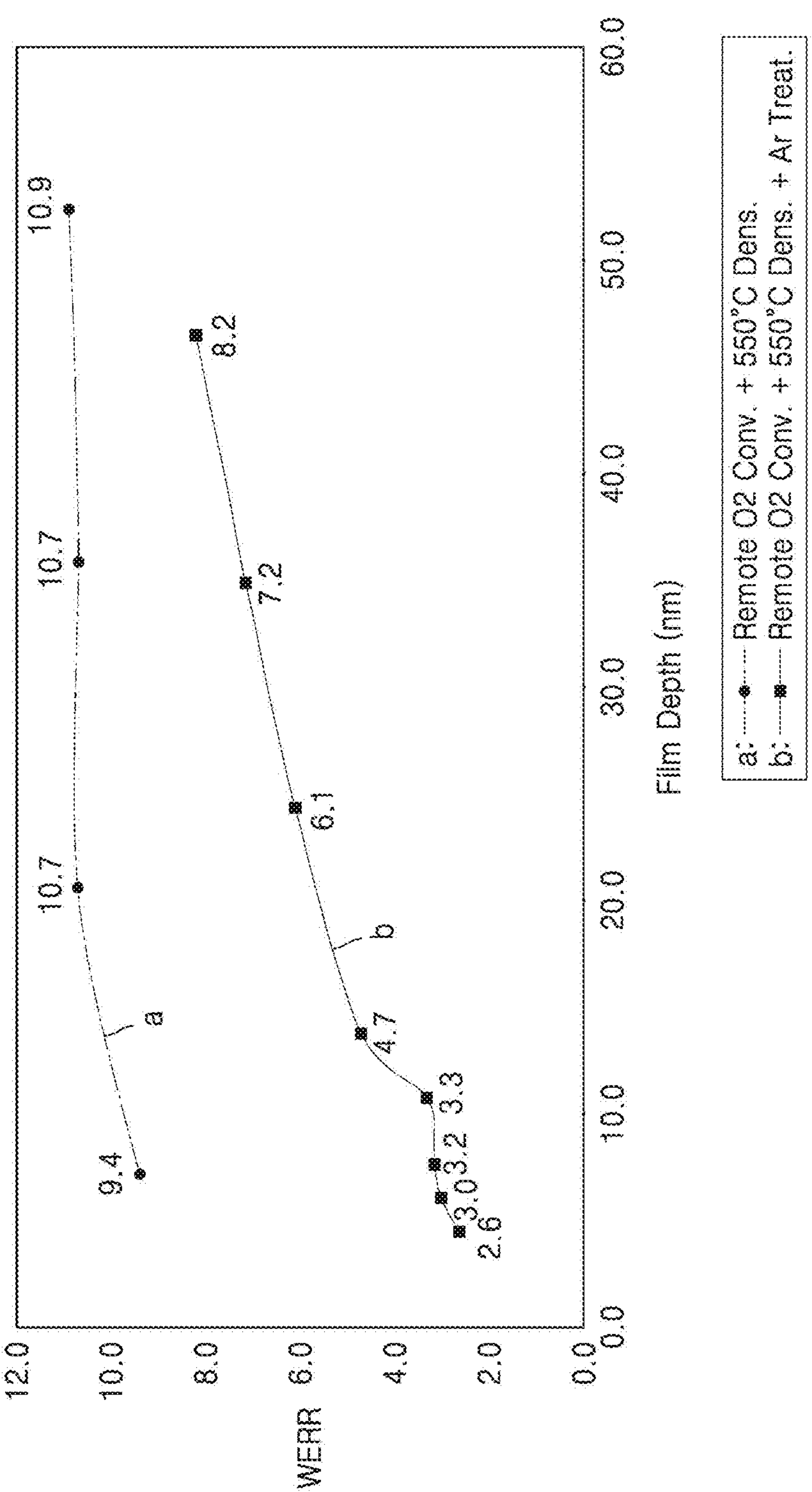
FIG. 5 shows changes in the wet etch rate ratio (WERR) of a silicon oxide thin film after performing a densification step (line a) and a silicon oxide thin film after performing an argon (Ar) gas plasma post-treatment step (line b).

FIG. 5 shows lines tracking changes in wet etch rate ratio (WERR) of the silicon oxide thin film after performing the densification step at 550° C. (line a), and the silicon oxide thin film after performing both the densification step at 550° C. and the subsequent Ar plasma post-treatment step (line b). Table 2 shows a summary of the changes in WERR shown in FIG. 5.

TABLE 2

| Conditions | WERR |
|---|---|
| Silicon oxide film after performing a remote $O_2$ plasma conversion step and densification step at 550° C. | 9.4 to 10.9 |
| Silicon oxide film after performing a remote $O_2$ plasma conversion step, densification step at 550° C., and argon plasma post-treatment step | 2.6 to 8.2 |

In particular, specific process conditions used for the remote plasma conversion step, densification step at 550° C., and argon plasma post-treatment step in FIG. 5 and Table 2 are as shown in Table 3 below. The wet etch rate ratios (WERR) shown in FIG. 5 and Table 2 are measurements obtained by dividing the wet etch rate (WER) of i) a silicon oxide thin film having a thickness of 10 nm to 60 nm, obtained after the conversion step using a remote oxygen plasma and the densification step at 550° C.; and ii) a silicon oxide thin film having a thickness of 10 nm to 60 nm, obtained after the conversion step using a remote oxygen plasma, the densification step at 550° C., and the Ar plasma post-treatment step carried out under conditions described in Table 3, by the WER of a thermal silicon oxide thin film having a thickness of 10 nm to 60 nm, obtained by thermal oxidation at 1,000° C. under an oxygen or steam atmosphere.

TABLE 3

| | | | | |
|---|---|---|---|---|
| Remote $O_2$ plasma conversion step | Gas | $O_2$ Flow Rate (sccm) | 1,000 to 3,000 | Process time: 1,000 to 2,000 sec |
| | | Ar Flow Rate (sccm) | 500 to 1,500 | |
| | Plasma Condition | RF Power (W) | 500 to 1,500 | |
| | | RF Frequency (MHz) | 10 to 30 | |
| | Process Pressure (Torr) | | 1.0 to 4.0 | |
| | Process Temperature (° C.) | | 50 to 150 | |
| Densification step at 550° C. | Gas | $O_2$ Flow Rate (sccm) | 500 to 2,000 | Process time: 3,000 to 5,000 sec |
| | Process Pressure (Torr) | | 2 to 10 | |
| | Process Temperature(° C.) | | 300 to 600 | |
| Argon plasma Post-treatment step | Gas | Ar (sccm) | 500 to 2,000 | Process time: 1,000 to 2,000 sec |
| | Plasma condition | RF Power (W) | 200 to 800 | |
| | | RF Frequency (MHz) | 10 to 30 | |
| | Process Pressure (Torr) | | 1.0 to 4.0 | |
| | Process Temperature (° C.) | | 50 to 150 | |

Referring back to FIG. 5 and Table 2, i) the silicon oxide thin film (line a) having a thickness of 10 nm to 60 nm, obtained after performing the conversion step using a remote oxygen plasma and the densification step at 550° C., produced a WERR value of 9.4 to 10.9. Meanwhile, ii) the silicon oxide thin film (line b) having a thickness of 10 nm to 60 nm, obtained after performing the conversion step using a remote oxygen plasma, the densification step at 550° C., and the Ar plasma post-treatment step, produced a WERR value of 2.6 to 8.2.

Comparing these two results, it was found that the silicon oxide thin film obtained by performing the Ar plasma post-treatment step after the conversion step using a remote oxygen plasma and the densification step according to the disclosure, regardless of the depth of the film, produced a lower WERR than the WERR for the silicon oxide thin film obtained by performing the conventional conversion step and the densification step alone. This indicates that the density of the film was improved regardless of the depth of the film. A smaller WERR of the thin film means that the thin film may be as highly dense and solid as thin films formed by thermal oxidation process. Therefore, according to the present disclosure, a dense and solid silicon oxide film having high quality may be efficiently formed despite using the flowable PECVD process. Such a silicon oxide film having high quality may effectively act as an etch stop layer, an insulating layer, a device separation layer, or the like, and also may be effective at preventing penetration of external impurities such as carbon and nitrogen.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of forming a silicon oxide film, the method comprising:

providing a substrate into a reaction chamber;

supplying a silicon precursor gas and a nitrogen reactant gas to the reaction chamber, and forming a flowable silicon nitride film on the substrate while maintaining a plasma atmosphere inside the reaction chamber;

converting the flowable silicon nitride film into a flowable silicon oxide film;

densifying the flowable silicon oxide film to form a densified silicon oxide film; and post-treating the densified silicon oxide film with an inert gas plasma to increase a density of the densified silicon oxide film.

2. The method of claim 1, wherein the forming the flowable silicon nitride film is performed by an in-situ plasma treatment which generates a plasma directly on the substrate by applying an RF power to the reaction chamber while supplying the silicon precursor gas and the nitrogen reactant gas to the reaction chamber, the RF power being in a range of greater than 0 W to about 500 W and having a frequency of about 10 MHz to about 60 MHz.

3. The method of claim 1, wherein in the forming the flowable silicon nitride film, a temperature of the substrate is maintained at about 0° C. to about 150° C.

4. The method of claim 3, wherein in the forming the flowable silicon nitride film, the temperature of the substrate is maintained at about 30° C. to about 70° C.

5. The method of claim 1, wherein in the forming the flowable silicon nitride film, the silicon precursor gas and the nitrogen reactant gas are supplied such that a ratio of Si atoms:N atoms in the flowable silicon nitride film is 1:1 or more (1:≥1).

6. The method of claim 1, wherein the converting comprises converting the flowable silicon nitride film into the flowable silicon oxide film by introducing a remote oxygen plasma to the flowable silicon nitride film.

7. The method of claim 1, wherein the densifying comprises forming the densified silicon oxide film by subjecting the flowable silicon oxide film to rapid thermal processing at a pressure of about 1.0 Torr to about 20.0 Torr and at a temperature of about 300° C. to about 550° C., while flowing oxygen gas at a flow rate of more than 0 sccm to about 5,000 sccm.

8. The method of claim 1, wherein, the post-treating is performed by an in-situ plasma treatment which generates the inert gas plasma directly on the substrate by applying an RF power to the reaction chamber while supplying argon (Ar) gas as the inert gas to generate Ar gas plasma, the RF power being in a range of more than 0 W to about 1,500 W and having a frequency of about 10 MHz to about 60 MHz.

9. The method of claim 8, wherein the densifying is performed for at least 30 minutes, and the post-treating using the Ar gas plasma is performed for at least 10 minutes.

10. The method of claim 8, wherein a wet etch rate of the silicon oxide film after performing the post-treating using the Ar gas plasma is reduced by at least 10% compared to a wet etch rate of the silicon oxide film after the densifying.

11. The method of claim 1, wherein the silicon precursor gas comprises at least one or a mixture of a silicon-containing oligomer, aminosilane, iodosilane, silicon hydrohalide, and silicon halide.

12. The method of claim 11, wherein the silicon precursor gas comprises at least one or a mixture of: TSA, $(SiH_3)_3N$; DSO, $(SiH_3)_2O$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2(N(Et)(Me))_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; and dimer-trisilylamine, trimer-trisilylamine, tetramer-trisilylamine, pentamer-trisilylamine, hexamer-trisilylamine, heptamer-trisilylamine, and octamer-trisilylamine.

13. The method of claim 1, wherein the nitrogen reactant gas comprises at least one selected from among $NH_3$, $N_2$, $N_2O$, $NO_2$, $N_2H_2$, $N_2H_4$, and a mixture thereof.

14. The method of claim 1, wherein the silicon precursor gas is a carbon-free silicon precursor gas, and the nitrogen reactant gas is $NH_3$.

15. The method of claim 6, wherein the remote oxygen plasma used in converting the flowable silicon nitride film is formed by applying an RF power in a range of greater than 0 W to about 5,000 W and having a frequency in a range of about 10 MHz to about 60 MHz.

16. The method of claim 1, wherein the converting the flowable silicon nitride film into the flowable silicon oxide film is further facilitated through the post-treating.

17. A method of forming a silicon oxide film, the method comprising:

providing a substrate to a reaction chamber;

supplying a silicon precursor gas and a nitrogen reactant gas into the reaction chamber, and forming a flowable silicon nitride film on the substrate while maintaining a plasma atmosphere inside the reaction chamber;

converting the flowable silicon nitride film into a flowable silicon oxide film;

densifying the flowable silicon oxide film to form a densified silicon oxide film; and post-treating the densified silicon oxide film by applying an inert gas plasma to increase a density of the densified silicon oxide film, wherein the converting the flowable silicon nitride film into the flowable silicon oxide film is further facilitated through the post-treating.

18. The method of claim 17, wherein the densifying is performed for at least 30 minutes, and the post-treating is performed for at least 10 minutes using an Ar gas plasma as the inert gas plasma.

19. A method of manufacturing a semiconductor device by using the method according to claim 1.

* * * * *